United States Patent [19]
Goto et al.

[11] Patent Number: 6,010,823
[45] Date of Patent: Jan. 4, 2000

[54] RESIST COMPOSITIONS FOR PLATING

[75] Inventors: Akihiko Goto; Yoshitaka Ono, both of Ibi-Gun, Japan

[73] Assignee: Ibiden Co., Ltd., Gifu Pref., Japan

[21] Appl. No.: 08/813,985

[22] Filed: Mar. 10, 1997

[30] Foreign Application Priority Data

Mar. 13, 1996 [JP] Japan .................................. 8-085802
Aug. 21, 1996 [JP] Japan .................................. 8-239855

[51] Int. Cl.$^7$ ............................................ G03C 1/73
[52] U.S. Cl. ................................. 430/280.1; 430/281.1; 430/286.1
[58] Field of Search ............................ 430/280.1, 281.1, 430/286.1

[56] References Cited

U.S. PATENT DOCUMENTS

| | | | |
|---|---|---|---|
| 4,902,726 | 2/1990 | Hayashi et al. | 430/280.1 |
| 4,948,700 | 8/1990 | Maeda et al. | 430/280.1 |
| 5,055,378 | 10/1991 | Miyamura et al. | 430/280.1 |
| 5,412,002 | 5/1995 | Enomoto et al. | 522/37 |
| 5,677,398 | 10/1997 | Motoshima et al. | 430/280.1 |

FOREIGN PATENT DOCUMENTS

| | | |
|---|---|---|
| 623 852 | 11/1994 | European Pat. Off. . |
| 2 580 828 | 10/1986 | France . |
| 39 25 895 | 2/1990 | Germany . |
| 3925895 | 2/1990 | Germany . |
| 57-90072 | 6/1982 | Japan . |
| 61-59447 | 3/1986 | Japan . |
| 1-266534 | 10/1989 | Japan . |
| 1-266534 A2 | 10/1989 | Japan . |
| 5-273755 | 10/1993 | Japan . |
| 6-317904 | 11/1994 | Japan . |
| 8-239640 A2 | 9/1996 | Japan . |

OTHER PUBLICATIONS

Database WPI, Section Ch, Week 8735, Derwent Publications Ltd., London, Jul. 22, 1987.
Chemical Abstracts, vol. 120, No. 26, Jun. 27, 1994.

*Primary Examiner*—Maria Nuzzolillo
*Assistant Examiner*—Laura Weiner
*Attorney, Agent, or Firm*—Oliff & Berridge, PLC

[57] ABSTRACT

A resist composition for plating comprises a partial-acrylated, uncured novolac type epoxy resin as a photosensitive resin ingredient and an imidazole curing agent as a curing agent, wherein the imidazole curing agent is liquid at 25° C. or the composition contains an acrylic ester polymer having a molecular weight of 500–5000. By using such a resist composition can be provided a printed wiring board having excellent conduction reliability and heat cycle property.

3 Claims, 6 Drawing Sheets

RESIST COMPOSITIONS FOR PLATING

BACKGROUND OF THE INVENTION

1. Field of the Invention

This invention relates to a resist composition for plating, a method of producing the same and a printed wiring board using the same, and more particularly to a resist composition for plating with a fine structure having excellent photosensitive properties, resistance to alkali and heat resistance and an improved surface smoothness without causing development residue irrespectively of anchor depth, a method of producing the same and a printed wiring board using such a resist composition for plating.

2. Description of Related Art

Recently, miniaturization and high-speeding of electronic equipment are proceeding with the advance of electron industry. For this end, it is required that printed wiring boards and wiring board mounting LSI have high density and reliability based on a fine pattern.

As a method of forming conductors on the wiring board, there has lately been noticed an additive method wherein an adhesive is applied onto a surface of a substrate to form an adhesive layer, and a surface of the adhesive layer is roughened, and the substrate is subjected to an electroless plating to form conductors on the adhesive layer. According to this method, the conductor is formed by the electroless plating after the formation of a resist, so that the wiring having high density and pattern accuracy can be produced in a lower cost as compared with an etched foil method of forming the pattern through etching (subtractive method).

In order to produce the wiring having higher density and pattern accuracy in low cost by the above additive method, the selection of resists is particularly important. That is, it is necessary to use a resist composition capable of sticking to the roughened surface of the adhesive layer under a high follow-up action, and having a high resolution, and leaving no development residue on the considerably roughened surface after the development, and being very less in the amount of eluted ingredient even if the immersion in a high alkali bath is carried out at a high temperature for a long time.

As the resist composition satisfying the above properties, there have primarily been used ones obtained by skillfully combining a binder polymer having an average molecular weight of not less than several hundred thousand such as PMMA or the like with acryl oligomer having a photosensitive group and acryl monomer from a viewpoint of film-forming property, resistance to plating bath and heat resistance.

However, the resist composition containing the above polymer as a main ingredient has drawbacks that since the average molecular weight of the polymer is very large, the resulting cured resist is small in the crosslinking density and is swollen by intrusion of alkali when it is immersed in a high alkali bath for plating or the like at a high temperature. As a result, the conventional cured resist is largely eluted out in the plating solution by hydrolysis reaction with alkali in the plating treatment to degrade the plating solution and the properties of the plated film so that it has a problem in the resistance to alkali.

As a technique of improving the resistance of the cured resist to alkali, therefore, there is proposed a resist ink composition for electroless metal plating comprising an epoxy resin, an aromatic amine curing agent for epoxy resin and an imidazole curing agent for epoxy resin as a main ingredient and containing an organic solvent, a thixotropic agent, a filler and a chemical plating inhibitor (see JP-A-57-90072). This technique is particularly concerned with a resist ink protecting the conductor pattern in a semi-additive method. The cured product of such a resist ink is sufficiently durable to the immersion in an alkali bath of pH=12–13 (20° C.) for a long time.

However, the resist ink according to this conventional technique is not sufficiently durable to the immersion in a high-temperature and high-alkali plating bath having pH of not less than 14 and a bath temperature of 80° C. for not less than 5 hours, for example, for electroless tin-lead alloy plating other than the above electroless copper plating. Further, the resist ink is a thermosetting resin composition, so that it can not be applied to the printed wiring board formed through the additive method requiring photosensitive properties in the resist composition.

As a technique that a resin possessing both a thermosetting property and a photosensitivity is used in the resist composition, there is proposed a photosensitive resin composition wherein a half ester obtained by acrylating a part of epoxy group in novolac type epoxy resin is used as a base material (see JP-A-61-59447). According to this technique, there can be obtained a resist having excellent photosensitivity and heat resistance.

However, this technique has a problem that a cured resist sufficiently durable to the high-temperature and high-alkali bath having pH of not less than 14 and a bath temperature of 80° C. can not stably be obtained without degrading the photosensitive properties.

In order to solve the above problems, therefore, JP-A-6-317904 discloses a resist composition for plating comprising an uncured novolac type epoxy resin in which a part of epoxy group is acrylated as a photosensitive resin ingredient and an imidazole curing agent as a curing agent and having excellent photosensitive properties, heat resistance and resistance to alkali. In this case, when an anchor depth is not more than 15 $\mu$m, fine pattern having L/S=50/50 $\mu$m or less can be obtained.

However, powder of the imidazole curing agent is actually used in the resist composition described in JP-A-6-317904, so that when the printed wiring board is actually manufactured by using such a resist composition, as shown in FIG. 1, the imidazole curing agent 2 existing at a crystal state projects from a side surface of the resulting resist pattern 3 formed by the exposure and development of the resist composition applied onto the adhesive layer 1 and hence there is caused a problem such as partial thinning or breaking of the wiring after the formation of the plated film. Furthermore, as the anchor depth becomes deeper, the development residue is generated and hence the fine pattern can not be obtained. Moreover, concave zones formed by deaeration after the application of the resist composition are observed on the surface of the cured resist, which is no problem when the pattern exceeds L/S=50/50, but if it is intended to provide the fine pattern, the plated film is precipitated in these concave zones to result in the occurrence of short-circuit between the wirings. And also, when the resist composition is liquid, if dusts or the like are adhered to the surface of the substrate, the resist composition is never applied to the dust existing portions.

In order to prevent the occurrence of the concave zone or the occurrence of non-applied portions through the dusts, there is proposed a method of adding an anti-foaming agent. In this case, the anti-foaming agent itself causes light scattering at a state of dispersing into the resist to create the development residue and hence there is caused a phenomenon of lowering the resolution of the resist for plating.

SUMMARY OF THE INVENTION

It is, therefore, an object of the invention to solve the aforementioned problems of the conventional techniques and to provide a resist composition for plating capable of improving a fine structure of a resist having excellent photosensitive properties, resistance to alkali and heat resistance to provide a wiring board ensuring a continuity reliability, preventing breakage of wiring and being strong in the heat cycle.

It is another object of the invention to provide a resist composition causing no development residue irrespectively of the anchor depth and having an excellent surface smoothness, a method of producing the same and a printed wiring board using the same.

According to a first aspect of the invention, there is the provision of a resist composition for plating comprising an uncured novolac type epoxy resin in which a part of epoxy group is acrylated as a photosensitive resin ingredient and an imidazole curing agent as a curing agent, wherein the imidazole curing agent is liquid at 25° C.

In a preferable embodiment of the first aspect, an acrylation ratio of epoxy group in the uncured novolac type epoxy resin is 20–80% and an amount of the imidazole curing agent is 2–8 parts by weight based on 100 parts by weight of the photosensitive resin ingredient.

In another preferable embodiment of the first aspect, the imidazole curing agent is at least one of compounds represented by the following formulae (1)–(3):

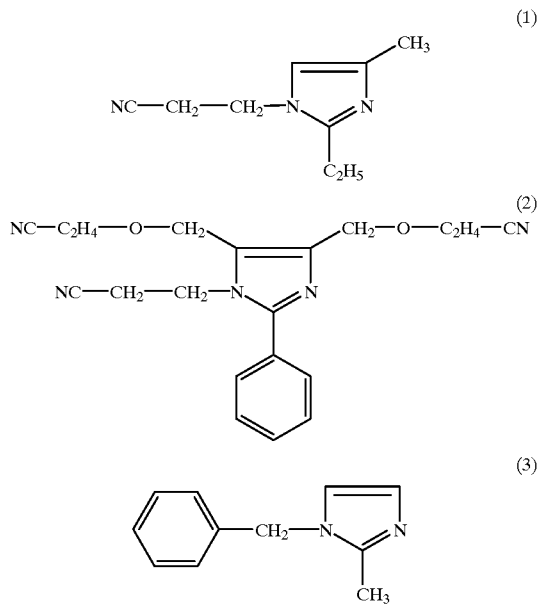

Furthermore, the inventors have made various studies with respect to the occurrence of development residue in the conventional resist composition and confirmed that the development residue does not result from the anchor depth but rather results from the ununiformity of the resist composition itself because the anti-foaming agent added is dispersed in the composition without dissolving in the cresol-novolac type epoxy resin and also benzophenone as a photoinitiator and Michler's ketone as a photosensitizer are not sufficiently compatible with the composition.

In this connection, it has been found that when an acrylic ester polymer having a molecular weight of 500–5000 is added instead of the conventional anti-foaming agent, the whole of the resulting composition is made uniform without lowering the resolution and the occurrence of concave zones on the surface of the resist can be prevented.

Furthermore, it has been found that benzophenone and Michler's ketone can sufficiently be compatibilized when they are simultaneously dissolved in a solvent of glycol ether or N-methyl pyrrolidone.

As a result, the whole of the composition can be uniformized and also the kneading conventionally required for the provision of liquid resist composition is made useless.

According to a second aspect of the invention, there is the provision of a resist composition for plating comprising an uncured novolac type epoxy resin in which a part of epoxy group is acrylated as a photosensitive resin ingredient and an imidazole curing agent as a curing agent, wherein the composition contains an acrylic ester polymer having a molecular weight of 500–5000.

In a preferable embodiment of the second aspect, the acrylic ester polymer is an ester polymer between acrylic acid or methacrylic acid and an alcohol having a carbon number of 1–10.

In another preferable embodiments of the second aspect, the composition contains benzophenone and Michler's ketone dissolved in a solvent of glycol ether or N-methyl pyrrolidone, and the glycol ether is diethylene glycol dimethyl ether or triethylene glycol dimethyl ether.

In the other preferable embodiment of the second aspect, the composition further contains bisphenol type epoxy resin and a photosensitive monomer.

In a further preferable embodiment of the second aspect, the imidazole curing agent is liquid at 25° C.

According to a third aspect of the invention, there is the provision of a method of producing a resist composition for plating comprising an uncured novolac type epoxy resin in which a part of epoxy group is acrylated as a photosensitive resin ingredient and an imidazole curing agent as a curing agent, characterized in that the composition is compounded with an acrylic ester polymer having a molecular weight of 500–5000.

In a preferable embodiment of the third aspect, benzophenone and Michler's ketone are mixed and dissolved in a solvent of glycol ether or N-methyl pyrrolidone and added to the composition.

In another preferable embodiment of the third aspect, bisphenol type epoxy resin and a photosensitive monomer are further added to the composition.

Further, the invention is concerned with a printed wiring board comprising a resist formed on an insulating layer and a conductor circuit formed between the resists, in which the resist is formed by curing anyone of the aforementioned resist compositions for plating.

BRIEF DESCRIPTION OF THE DRAWINGS

The invention will be described with reference to the accompanying drawings, wherein.

DESCRIPTION OF THE PREFERRED EMBODIMENTS

Figure 1:
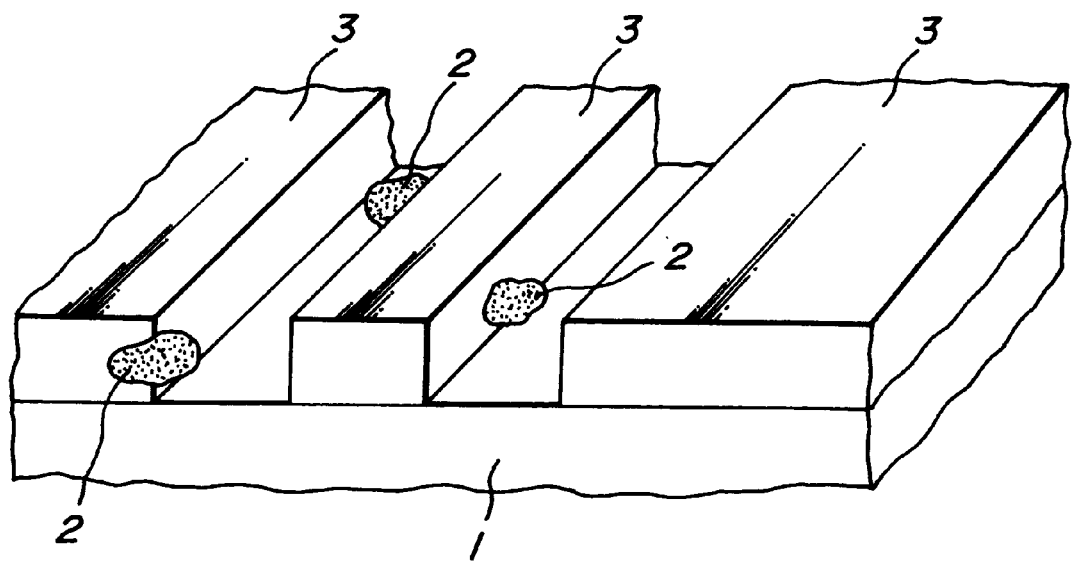
FIG. 1 is a diagrammatic view illustrating a state of curing the conventional resist composition containing the powdery imidazole curing agent.

A first embodiment of the resist composition for plating according to the invention comprises an uncured novolac type epoxy resin in which a part of epoxy group is acrylated as a photosensitive resin ingredient and an imidazole curing agent as a curing agent, wherein the imidazole curing agent is liquid at 25° C.

The liquid imidazole curing agent is existent at a state of uniformly dispersing in the molecule of the uncured resin ingredient, so that even if the resist composition is cured, such a curing agent is existent at a state of uniformly dispersing in the cured product. Therefore, when a resist pattern is formed by the exposure and development of the resist composition, the imidazole curing agent existing at a crystal state does not project from a side surface of the resist pattern, and hence there is caused no partial thinning or breaking of a conductor circuit.

On the other hand, when the conventional powdery curing agent is used instead of the liquid curing agent, a part of the powdery curing agent is locally existent at an unreacted state in the resin after the curing and projects from the side surface of the resist pattern. As a result, when a voltage is applied at high temperature and humidity after the formation of the conductor circuit, such a remaining curing agent corrodes a copper conductor or reacts with the copper conductor to generate ion and hence insulation resistance may be lowered. In the invention, the liquid curing agent does not remain at an unreacted state, so that the reliability of the conductor circuit can be improved.

The imidazole curing agent according to the invention may use any well-known imidazole curing agent being liquid at 25° C. but is desirable to be at least one selected from compounds represented by the following formulae (1) to (3):

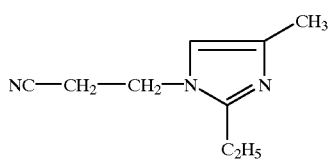
(1)

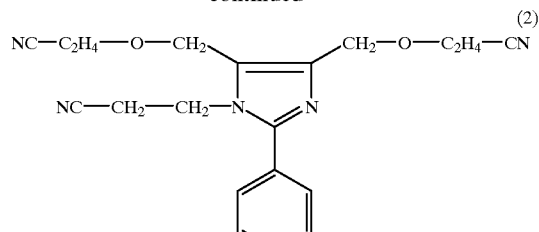
(2)

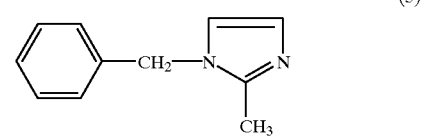
(3)

All of these compounds are liquid at room temperature (25° C.) and are uniformly dispersed in the resist after the curing, while the cured resist is excellent in the resistance to base, resistance to acid and resistance to oxidizing agent.

They are commercially available, in which the compound of the formula (1) corresponds to a trade name of 2E4MZ-CN made by Shikoku Kasei Co., Ltd., and the compound of the formula (2) corresponds to a trade name of 2PHZ-CN made by Shikoku Kasei Co., Ltd., and the compound of the formula (3) corresponds to a trade name of 1B2MZ made by Shikoku Kasei Co., Ltd.

The above curing agent is used in an amount of 1–10 parts by weight, preferably 2–8 parts by weight, more particularly 4–6 parts by weight based on 100 parts by weight of the photosensitive resin ingredient. When the amount is less than 1 part by weight, the curing is insufficient and the crosslinking density of the cured product becomes small and hence the desired alkali resistance is not obtained, while when it exceeds 10 parts by weight, since the water absorption of the imidazole compound itself is high, the water absorption of the cured product rises and hence the alkali resistance inversely lowers.

The reason why the imidazole curing agent is used in the invention is due to the following facts. That is, acid anhydrides and imidazole compounds are used as a curing agent for a thermosetting resin having epoxy group therein. When using the acid anhydride, the following chemical reaction occurs.

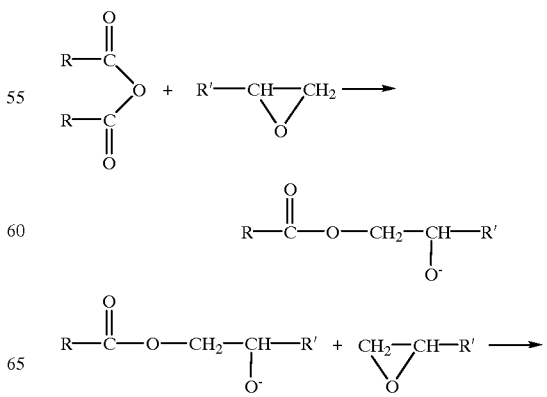

-continued

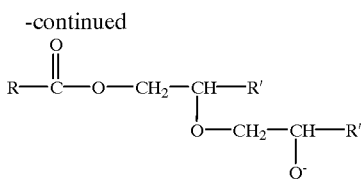

However, the resulting cured resist causes hydrolysis under basic condition due to its ester structure, so that the alkali resistance is poor. Since the electroless plating solution is strong basic from a viewpoint of the necessity forming a metal complex, the resist is required to have a resistance to base.

On the other hand, the imidazole curing agent takes the following chemical reaction, so that the ester structure is not formed and the resistance to base is excellent.

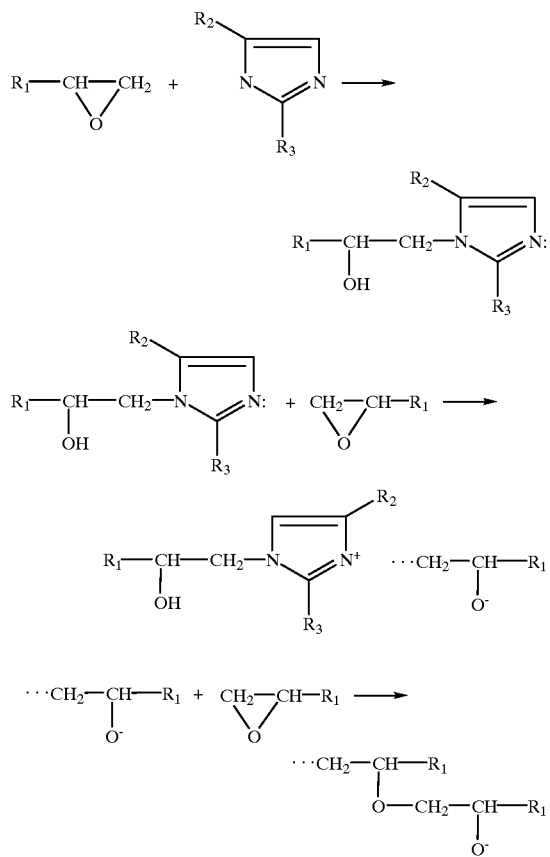

Further, the printed wiring board provided with the resist may be treated with acid or oxidizing agent, so that the resist must be hardly soluble in acid or oxidizing agent. However, the cured product using the imidazole curing agent is relatively stable to acid or oxidizing agent.

The invention will be described with respect to the photosensitive resin ingredient below.

The photosensitive rein ingredient used in the invention is an uncured novolac type epoxy resin in which a part of epoxy group is acrylated (hereinafter referred to as partial-acrylated).

In general, the photosensitive resin for the formation of the resist is (metha)acrylic monomer, oligomer or polymer represented by $CH_2=CR_1COOR_2$ or $(-CH_2-CR_1COOR_2-)n$ as an essential ingredient from a viewpoint of photosensitive properties. When such a resin is subjected to a crosslinking reaction, the resulting cured product is apt to have an ester structure of $R_1-COOR_2$. Further, it has been known that the resin having such an ester structure creates hydrolysis in the presence of an alkali as shown in the following reaction formula:

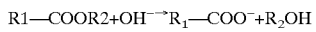

Furthermore, the photosensitive resin is necessary to be based on epoxy resin from a viewpoint of the heat resistance.

In the invention, it is possible to reduce the molecular weight between crosslinking points of the cured product by using the partial-acrylated, uncured novolac type epoxy resin as the photosensitive resin ingredient while maintaining the photosensitive properties, whereby the intrusion of alkali in the high-alkali treatment at high temperature can effectively be prevented to improve the alkali resistance.

The above novolac type epoxy resin has a structure of repeating units of epoxy group as a functional group and benzene ring in which the number of benzene rings is the same as the number of functional groups forming the crosslinking point. Moreover, since such a resin is not a long-chain polymer, the resulting cured product has a greater number of crosslinking points and benzene rings per unit volume. As a result, it is considered that the molecular motion of the cured product is controlled in the high-alkali treatment at high temperature, whereby the intrusion of alkali can be prevented and OH group is hardly reacted with a polar group in the cured product.

Further, when the above-defined imidazole curing agent is used as a curing agent for such an epoxy resin, it is possible to control the esterification in the curing and hence the hydrolysis reaction through alkali can be prevented to improve the alkali resistance.

In the invention, the uncured novolac type epoxy resin as a photosensitive rein ingredient of the resist composition is partially acylated for establishing high resolution (photosensitive property) and alkali resistance. In this case, the acrylation ratio of epoxy group is restricted to 20–80%, preferably 25–50%. Thus, the desired photosensitive property (resolution) of the resist is attained by restricting the acrylation ratio to the above range, while the alkali resistance of the resist may be improved by using the novolac type epoxy resin as the resin ingredient.

When the acrylation ratio is less than 20%, the developability of the resist is poor and it is difficult to form a fine pattern, while when it exceeds 80%, the sufficient alkali resistance is not obtained. Moreover, the acrylation of epoxy group is carried out by using acryloyl group ($CH_2=CHCO-$), methacryloyl group ($CH_2=C(CH_3)CO-$) or the like.

The uncured novolac type epoxy resin is favorable to have an epoxy equivalent of not more than 300, preferably not more than 250. When the epoxy equivalent exceeds 300, the molecular weight between the crosslinking points of the cured epoxy resin becomes larger and the intrusion of alkali is easy and the alkali resistance is degraded. Moreover, the term "epoxy equivalent" used herein means a weight (g) of the epoxy resin per 1 gram equivalent of epoxy group.

In the invention, the novolac type epoxy resin having such a functional group is included in an amount of not less than 50% by weight, preferably not less than 70% by weight per total resin ingredient. When the amount of such a novolac type epoxy resin is less than 50% by weight, the molecular weight between the crosslinking points of the cured resist can not sufficiently be decreased.

In the resist composition for plating according to the invention, a thermosetting resin, a thermoplastic resin, a photosensitive resin, a photoinitiator and the like may properly be compounded in addition to the above defined novolac type epoxy resin such as cresol-novolac type epoxy resin, phenol-novolac type epoxy resin and the like, and also a photosensitizer may be added, if necessary.

As the thermosetting resin, use may be made of an epoxy resin, an allyl resin, a melamine resin, a urea resin and the like. As the thermoplastic resin, use may be made of polyether sulfon, polyether imide, phenoxy resin and the like. As the photosensitive resin, use may be made of conventionally known monofunctional or polyfunctional photosensitive resins having a molecular weight of not more than 10,000. Moreover, the thermosetting resin or photosensitive resin may more advantageously be used as the molecular weight between the crosslinking points after the thermosetting or photo-curing becomes small. As the photoinitiator, use may be made of at least one of intramolecular bond cleavage type compounds such as benzoisobutyl ether, benzyl dimethyl ketal, diacetoxyphenone, acyloxim ester, chlorinated acetophenone, hydroxyacetophenone and the like, and intermolecular hydrogen-drawing type compounds such as benzophenone, Micheler's ketone, dibenzosuberone, 2-ethyl anthraquinone, isobutyl thioxanthone and the like. As the photosensitizer, use may be made of triethanol amine, dimethyldiethanol amine, triisopropanol amine, Michler's ketone, 4,4-diethylamino benzophenone, 2-dimethylaminoethyl benzoic acid, 4-dimethylamino benzoic acid, (n-butoxy)ethyl 4-dimethylaminobenzoate, isoamyl 4-dimethylaminobenzoate, 2-ethylhexyl 4-dimethylaminobenzoate, polymerizable tertiary amine and the like.

As the photosensitive resin ingredient in the resist composition for plating according to the invention, resins containing no solvent can be used as they are, but the solution of the resin in the solvent may advantageously be used because the adjustment of viscosity can easily be conducted and the film can easily be formed. As the solvent used in the dissolution of the resin, mention may be made of usual ones such as methyl ethyl ketone, methylcellosolve, ethylcellosolve, butylcellosolve, butylcellosolve acetate, butylcarbitol, butylcellulose, tetralin, dimethylformamide, normalmethyl pyrrolidone and the like.

Moreover, additives such as coloring agent (pigment), leveling agent, anti-foaming agent, ultraviolet ray absorbing agent, flame retardant and the like, and heat-resistant fine powder and other filler may properly compounded with the resist composition for plating according to the invention.

Particularly, the heat-resistant fine powder to be dispersed into the uncured photosensitive resin ingredient is necessary to be excellent in the heat resistance and the electrical insulating properties and stable to usual chemicals, so that it is favorable to use fine powder of previously cured heat-resistant resin or inorganic fine powder. As the heat-resistant resin for the formation of fine powder, use may be made of epoxy resin, melamine resin, phenolic resin and the like. As the inorganic fine powder, use may be made of silica and the like.

The heat-resistant fine powder is favorable to have an average particle size of not more than 10 $\mu$m, preferably 0.5–5 $\mu$m. When the average particle size is more than 10 $\mu$m, the application of the resist composition can not be followed to fine unevenness of the surface of the adhesive layer and hence the fine conductor pattern is hardly obtained.

A second embodiment of the resist composition for plating according to the invention comprises a partial-acrylated, uncured novolac type epoxy resin as a photosensitive resin ingredient and an imidazole curing agent as a curing agent, and contains an acrylic ester polymer having a molecular weight of 500–5000.

The acrylic ester polymer used in the invention has a compatibility with the photosensitive resin ingredient, so that it is not dispersed in the resist composition and there is caused no development residue, and also it is possible to easily escape bubbles. Although the mechanism developing such leveling action and anti-foaming action is not clear, it is guessed that the acrylic ester polymer acts as a kind of lubricant between molecules of the partial-acrylated novolac type epoxy resin. For this end, it is considered that even if the unevenness is created on the surface of the resist after the application of the resist composition, the molecules of the partial-acrylated novolac type epoxy resin easily slip with each other and the surface is smoothened with the lapse of time and bubbles are easily escaped. Further, the resistance to base is not lowered because the acrylic ester polymer is not a base resin.

The acrylic ester polymer used in the invention is desirable to be an ester polymer between an alcohol having a carbon number of 1–10, preferably 3–8 and acrylic acid, methacrylic acid or a derivative thereof. As the alcohol, mention may be made of monovalent alcohols such as propyl alcohol, isopropyl alcohol, n-butyl alcohol, tert-butyl alcohol, isobutyl alcohol, pentyl alcohol, hexyl alcohol, octyl alcohol, 2-ethylhexyl alcohol, amyl alcohol and the like; and polyvalent alcohols such as 1,2-ethanediol and the like.

The above acrylic ester polymer is excellent in the compatibility with the partial-acrylated novolac type epoxy resin and is particularly desirable to be a polymer of at least one acrylic ester selected from 2-ethylhexyl acrylate, butyl acrylate, ethyl acrylate and hydroxyethyl acrylate. It is considered that 2-ethylhexyl acrylate has a capillary action owing to the branching and prevents the resist from springing out by dust or the like, and butyl acrylate bears the leveling action and anti-foaming action, while ethyl acrylate and hydroxyethyl acrylate improve the compatibility. Each of the above four acrylates is polymerized alone and then the resulting homopolymers may be used alone or in admixture of two or more homopolymers. Alternatively, two or more acrylates among the four acrylates are copolymerized and then the resulting copolymers may be used alone or in admixture thereof.

For example, when the four acrylates are simultaneously used, it is desirable that a weight ratio of 2-ethylhexyl acrylate to butyl acrylate is 40/60–60/40, and a weight ratio of mixture of 2-ethylhexyl acrylate and butyl acrylate to ethyl acrylate is 90/10–97/3, and a weight ratio of mixture of 2-ethylhexyl acrylate and butyl acrylate to hydroxyethyl acrylate is 95/5–99/1.

In the invention, the molecular weight of the acrylic ester polymer is restricted to a range of 500–5000. Within such a molecular weight range, the acrylic ester polymer is liquid at 25° C. and is easily mixed with the photosensitive resin and so on in the preparation of the resist composition. When the molecular weight exceeds 5000, the viscosity becomes higher and hence the leveling action and anti-foaming action are lowered, while when it is less than 500, the leveling action and anti-foaming action are not developed. Preferably, the molecular weight of the acrylic ester polymer is 2000–3000. In the latter case, the viscosity of the acrylic ester polymer becomes 250–550 cp (25° C.) and the preparation of the resist composition is easier.

The amount of the acrylic ester polymer used is 0.1–5 parts by weight, preferably 0.2–1.0 part by weight based on 100 parts by weight of the photosensitive resin ingredient. When the amount is less than 0.1 part by weight, the leveling action and anti-foaming action are lowered and the surface of the resist is not smoothened and hence it is difficult to form a good resist and short-circuit is apt to be caused between conductor patterns. While, when it exceeds 5 parts by weight, the glass transition point lowers and the heat resistance degrades and also the adhesion property between the resist and the adhesive layer lowers.

If necessary, benzophenone and Michler's ketone dissolved in a solvent of glycol ether or N-methyl pyrrolidone may be included in the resist composition of the second embodiment.

In this case, commercially available benzophenone can be used as it is. The amount of benzophenone used is 1–20 parts by weight, preferably 2–5 parts by weight based on 100 parts by weight of the photosensitive resin ingredient. When the amount is less than 1 part by weight, photopolymerization reaction is not progressing and the resist can not be formed according to a photomask pattern, while when it exceeds 20 parts by weight, the sensitivity of the photosensitive resin is too high and a zone extending beneath the photomask is exposed and hence the development treatment can not be conducted.

On the other hand, commercially available Michler's ketone can be used as it is. The amount of Michler's ketone used is 0.1–5 parts by weight, preferably 0.2–1 part by weight based on 100 parts by weight of the photosensitive resin ingredient. When the amount is less than 0.1 part by weight, photopolymerization reaction is not progressing and the resist can not be formed according to a photomask pattern, while when it exceeds 5 parts by weight, the sensitivity of the photosensitive resin is too high and a zone extending beneath the photomask is exposed and hence the development treatment can not be conducted.

Furthermore, commercially available glycol ether or N-methyl pyrrolidone may be used as they are. As the glycol ether, there can particularly be used a compound represented by the following formula:

CH$_3$O—(CH$_2$CH$_2$O)$_n$—CH$_3$ (n=1–5), and diethylene glycol dimethyl ether (DMDG) and triethylene glycol dimethyl ether (DMTG) are particularly desirable. Moreover, the glycol ether is favorably used by heating to 30–50° C. The amount of the solvent used is 0.5–5 times, preferably 1–2 times the total weight of benzophenone and Michler's ketone.

In the invention, benzophenone as a photoinitiator and Michler's ketone as a photosensitizer are completely dissolved in the solvent of glycol ether or N-methyl pyrrolidone, whereby the resulting resist composition is rendered into a uniform phase and hence the occurrence of unexposed zone can completely be prevented in the development treatment.

The partial-acrylated, uncured novolac type epoxy resin used in this embodiment is the same as used in the aforementioned first embodiment of the resin composition.

In the invention, the imidazole curing agent may be used in form of powder or liquid. However, the use of the liquid imidazole curing agent is preferable as previously mentioned.

The second embodiment of the resist composition is favorable to further contain bisphenol type epoxy resin and a photosensitive monomer because the bisphenol type epoxy resin can improve the resistance to base and the photosensitive monomer can improve the resolution.

As the bisphenol type epoxy resin, there are bisphenol-A type epoxy resin and bisphenol-F type epoxy resin. The former is favorable in view of the resistance to base, and the latter is favorable in view of the applicability.

As the photosensitive monomer, there are favorably used polyvalent acrylates such as DPE6A (trade name) made by Nippon Kayaku Co., Ltd. and R604 (trade name) made by Kyoeisha Kagaku Co., Ltd., which are represented by the following formulae;

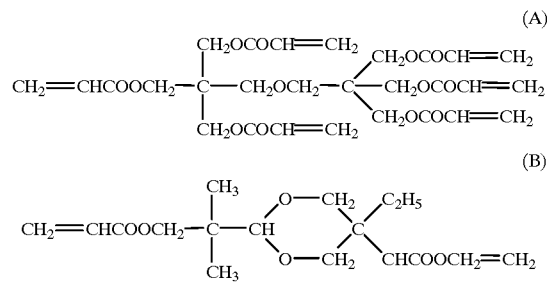

The amount of the bisphenol type epoxy resin used is 10–50 parts by weight, preferably 20–40 parts by weight based on 100 parts by weight of the photosensitive rein ingredient, while the amount of the photosensitive monomer used is 5–20 parts by weight, preferably 8–15 parts by weight based on 100 parts by weight of the photosensitive rein ingredient.

Furthermore, the second embodiment of the resist composition according to the invention may properly compounded with a thermosetting resin, a thermoplastic resin, additives such as coloring agent (pigment), leveling agent, ultraviolet ray absorbing agent and flame retardant, heat-resistant fine powder and the like as defined in the aforementioned first embodiment of the resist composition.

The invention will be described with respect to a method of producing the second embodiment of the resist composition according to the invention below.

In the invention, the acrylic ester polymer having a molecular weight of 500–5000 is compounded with a resist composition comprising the partial-acrylated, uncured novolac type epoxy resin as a photosensitive resin ingredient and an imidazole curing agent as a curing agent.

Furthermore, benzophenone and Michler's ketone are mixed and dissolved in the solvent of the glycol ether or N-methyl pyrrolidone and added to the above composition. In this case, it is important that benzophenone and Michler's ketone are simultaneously mixed and dissolved in the solvent because when only one of benzophenon and Michler's ketone is dissolved in the solvent, the solubility is too low and insoluble matter is created even in the heating and precipitation is caused at room temperature. Moreover, when using the glycol ether solvent, it is favorable to heat it to 30–50° C.

Although it is not clear that benzophenone and Michler's ketone are dissolved in the solvent at the simultaneously mixed state, it is guessed that benzophenone and Michler's ketone take a structure similar to a complex in the solvent and hence the solubility of Michler's ketone is enhanced owing to the complex similar structure. Thus, benzophenone and Michler's ketone are completely dissolved in the solvent, so that they are a uniform phase in the resist composition and hence the occurrence of unexposed zone can completely be prevented in the development treatment.

When benzophenone and Michler's ketone are added to the resist composition, it is preferable that the partial-acrylated novolac type epoxy resin, imidazole curing agent, and, if necessary, bisphenol type epoxy resin, photosensitive monomer and the like are mixed with the acrylic ester polymer to prepare a mixed solution, and then mixed with a mixed solution of benzophenone and Michler's ketone dissolved in the solvent of glycol ether or N-methyl pyrrolidone to prepare a uniform solution.

The resist composition for plating according to the invention is applied onto, for example, a base film by means of a roll coater, a doctor bar or the like, and then dried in a drying furnace set to 60–100° C. to remove a given amount of the solvent, whereby a resist film is formed at B-stage state, which is favorable in view of thickness uniformity and productivity. In this case, the thickness of the resist film formed on the base film is adjusted to 15–150 μm by a gap of the doctor bar. Since the resist film is taken up in form of roll, it is desirable to protect the resist at an uncured state by arranging a protection film (cover film) on the resist.

As the base film, use may be made of polyethylene terephthalate film, polypropylene film, polyethylene fluoride film (Tedolar film) and the like. The thickness of the base film is desirable to be 5–100 μm. Moreover, the surface of the base film forming the resist film may be subjected to a mat treatment (unevenness treatment) for preventing the springing out of the resist from the base film. And also, another surface of the base film may be subjected to a mat treatment (unevenness treatment) for preventing the occurrence of contusion or depression in the resist film through foreign matter during the take-up of the resist film. In order to facilitate the peeling removal of the base film, silicon may be applied to the surface of the base film contacting with the resist film as a releasing treatment. The resist film according to the invention may be produced by directly applying the resist composition on a given place without using the base film.

The invention will be described with respect to an example of the method of producing a printed wiring board by using the resist composition for plating according to the invention below.

At first, an adhesive layer is formed on a surface of a substrate such as glass epoxy substrate, polyimide substrate, ceramic substrate, metal substrate or the like according to usual manner, and then the surface of the adhesive layer is roughened by using an acid or oxidizing agent according to usual manner, and thereafter a catalyst is applied and fixed to the roughened surface of the adhesive layer. As the adhesive constituting the adhesive layer, there is favorably used an adhesive for so-called additive method formed by dispersing a resin filler into the resin ingredient. As the resin ingredient, the use of a photosensitive resin is desirable. Further, anchor recessions appearing on the roughened surface of the adhesive layer are desirable to have an average depth of not more than 15 μm, whereby the conductor pattern can be rendered into a fine pattern of L/S=50/50 (μm) or less.

Next, the resist film according to the invention is applied to the surface of the adhesive layer and laminated thereonto by pressing under heating. Thereafter, the resulting laminate is subjected to exposure through a pattern mask, development and ultraviolet ray curing and heat treatment, whereby a resist printed in a given pattern is formed. Moreover, when the resist composition obtained by dispersing the heat-resistant fine powder into the heat-resistant photosensitive resin ingredient is applied to the base film to form the resist film, the base film is peeled off from the resist film after the application to the adhesive layer, and then the resist having a given pattern is formed by the exposure, development, UV curing and heat treatment.

After the catalyst is activated by an acid treatment, an electroless plating is carried out to form a necessary conductor pattern, whereby a desired printed wiring board is obtained.

In the thus obtained printed wiring board, the pattern of the conductor circuit is formed between the patterned resist formed on the insulating adhesive layer, in which the resist is obtained by curing the resist composition for plating according to the invention. As the printed wiring board, mention may be made of various well-known printed wiring boards comprising the conductor circuit formed by the electroless plating, but they are included within a scope of the invention if the conductor circuit is formed between the patterned resists formed by the photocuring of the resist composition for plating.

In such a wiring board, the water absorption of the cured resist is desirable to be not more than 0.1%, preferably not more than 0.05%. When the water absorption is not more than 0.1%, the crosslinkling density is high and nucleophilic attack of OH– is impossible and hence the decomposition of the resin hardly occurs.

The following examples are given in illustration of the invention and are not intended as limitations thereof.

EXAMPLE 1
(Production of Multilayer Printed Wiring Board)

(1) A photosensitive dry film is laminated on a glass epoxy copper-clad laminate, which is exposed, developed and etched with an etching solution of copper chloride to obtain a wiring board having a first conductor circuit layer. Further, this wiring board is subjected to an oxidation-reduction treatment for surface roughening and a filling resin obtained by mixing 100 parts by weight of solvent-free epoxy resin, 170 parts by weight of silica powder (1.6 μm) and 6 parts by weight of imidazole curing agent is applied to the surface thereof and cured at 150° C. for 10 hours.

(2) A photosensitive resin composition for an insulating adhesive layer is obtained by kneading in a purl mill 40 parts by weight of 50% acrylated product (CNA-50, trade name, made by Kyoeisha Kagaku Co., Ltd.) of cresol-novolac type epoxy resin dissolved in 10 parts by weight of diethylene glycol dimethyl ether (DMDG), 20 parts by weight of epoxy resin (Epikote 1001, trade name, made by Yuka Shell Co., Ltd.), 6 parts by weight of a photosensitive monomer (Kayarad TMPTA, trade name, made by Nippon Kayaku Co., Ltd.), 4 parts by weight of liquid imidazole curing agent (Curesol 2PHZ-CN, trade name, made by Shikoku Kasei Co., ltd.), 4 parts by weight of a photocuring initiator (Irgaquar 907, trade name, made by Ciba Geigy), 1 part by weight of a photosensitizer (Kayacure DETX-S, trade name, made by Nippon Kayaku Co., Ltd.), 20 parts by weight of epoxy resin particles (Torepearl, trade name, made by Toray Industries, Inc.) having an average particle size of 5 μm and 5 parts by weight of the epoxy resin particles having an average particle size of 0.5 μm.

(3) The photosensitive resin composition is applied to the wiring board obtained in the item (1) by means of a roll coater (made by Dainippon Screen Co., Ltd.), left to stand at a horizontal state for 20 minutes, and then dried at 70° C. for 30 minutes.

(4) After a polyethylene terephthalate film provided at its back surface with an adhesive mass is adhered to the wiring board obtained in the item (3) so as to shut off the contact with oxygen inhibiting polymerization reaction, a photomask film is laminated thereonto, which is exposed to a super-high pressure mercury lamp at 0.5 J/cm$^2$ and heated at 80° C. for 10 minutes.

Then, it is developed with triethylene glycol dimethyl ether (DMTG), dried at 80° C. for 1 hour, exposed to an ultraviolet ray at 3 J/cm$^2$ and heated at 120° C. for 1 hour and at 150° C. for 5 hours to form an insulating adhesive layer having a thickness of 50 μm and openings corresponding to the photomask film with an excellent dimensional accuracy.

(5) The wiring board treated in the item (4) is immersed in chromic acid at 70° C. for 10 minutes to remove off resin particles and form a roughened surface of the adhesive layer containing many fine anchors.

(6) Then, a catalyst nucleus required for a first precipitation of a metal in subsequent electroless plating is given by treating in a solution containing 0.2 g/l of $PdCl_2.2H_2O$, 15 g/l of $SnCl_2.2H_2O$ and 30 g/l of HCl and fixed by heat treatment.

(7) A resist composition for plating according to the invention is prepared by mixing and kneading 70 parts by weight of 50% acrylated product (CNA-50, trade name, made by Kyoeisha Kagaku Co., Ltd.) of cresol-novolac type epoxy resin dissolved in 30 parts by weight of triethylene glycol dimethyl ether (DMTG), 30 parts by weight of epoxy resin (Epikote 1001, trade name, made by Yuka Shell Co., Ltd.), 2.5 parts by weight of a photosensitive monomer (Kayarad R-604, trade name, made by Nippon Kayaku Co., Ltd.), 5 parts by weight of a photosensitizer (DPF-6A, trade name, made by Nippon Kayaku Co., Ltd.), 5 parts by weight of liquid imidazole curing agent (Curesol 2PHZ-CN, trade name, made by Shikoku Kasei Co., Ltd.) and 5 parts by weight of benzophenone and 1 part by weight of Micheler's ketone as a photocuring initiator (both made by Kanto Kagaku Co., Ltd.).

(8) The resist composition obtained in the item (7) is applied to the wiring board at a thickness of 20 μm by means of a roll coater (made by Dainippon Screen Co., Ltd.) and dried at 80° C. for 30 minutes. (9) A film having a pattern of L/S=25/25 μm is placed on the board, which is irradiated by an exposing machine (made by Hightec Co., Ltd.) at 700 $mJ/cm^2$ and heated at 80° C. for 130 minutes.

(10) After the board is developed with a developing solution (DMTG), it is dried at 80° C. for 130 minutes, exposed to an ultraviolet ray at 4 $J/cm^2$ through a UV exposing machine and heated at 120° C. for 1 hour and at 150° C. for 3 hours to form a resist having a given pattern.

(11) After activation treatment is carried out in an aqueous solution of 100 g/l of sulfuric acid, the board is subjected to a primary plating with an electroless plating solution. Concretely, the primary plating is carried out by using an electroless copper-nickel alloy plating bath having the following composition. The temperature of the plating bath is 60° C., and the plating time is 1 hour.

Metal salt . . . $CuSO_4.5H_2O$: 6.0 mM(1.5 g/l) . . . $NiSO_4.6H_2O$: 95.1 mM(25 g/l)

Complexing agent . . . $Na_3C_6H_5O_7$: 0.23 M(60 g/l)

Reducing agent . . . $NaPH_2O_2.H_2O$: 0.19 M(20 g/l)

pH adjusting agent . . . NaOH: 0.75 M(pH=9.5)

Surfactant: 0.05 g/l

Precipitation rate: 2.0 μm/h

The plating is carried out under the above conditions to form a copper-nickel-phosphorus plated thin film having a thickness of about 1.7 μm on portions containing no resist. Thereafter, the board is taken out from the plating bath and washed with water to remove the remaining plating solution from the surface thereof.

(12) Then, oxide film is removed off from the surface layer of the copper-nickel-phosphorus plated thin film by treating the board with an acidic solution. Thereafter, a secondary plating is carried out to the copper-nickel-phosphorus plated thin film without conducting Pd substitution. A secondary plating bath having the following composition is used at a bath temperature of 50–70° C. for a plating time of 90–360 minutes.

Metal salt . . . $CuSO_4.5H_2O$: 8.6 mM

Complexing agent . . . triethanolamine: 0.15 M

Reducing agent . . . HCHO: 0.02 M

Others . . . stabilizing agent (bipyridyl, potassium ferrocyanide and the like) small Precipitation rate: 6 μm/h In this example, the secondary plating time is 2.2 hours. Thus, copper pattern having a thickness of 15 μm and viaholes are formed by the primary plating and the secondary plating.

(13) When a continuity test is made to the thus obtained printed wiring board having a pattern of L/S=25/25 μm, a ratio of product having no continuity (percentage of rejects) is 0.5%. When the board is subjected to a gas phase cooling-heating cycle test of −65° C.–125° C. or 1000 cycles, a change rate of conductive resistance is not more than 1%.

EXAMPLE 2

A printed wiring board is produced by repeating the same procedure as in Example 1 except the following two points.

(1) Resist Composition for Plating

The resist composition is prepared by mixing and kneading 80 parts by weight of 50% acrylated product (CNA-50, trade name, made by Kyoeisha Kagaku Co., Ltd.) of cresol-novolac type epoxy resin dissolved in 40 parts by weight of normalmethyl pyrrolidone (NMP), 20 parts by weight of polyether sulfon (PES, made by Mitsui Toatsu Chemicals, Inc.) as a thermoplastic resin, 20 parts by weight of a photosensitive monomer (Aronix M215, trade name, made by Toa Gosei Co., Ltd.), 5 parts by weight of liquid imidazole curing agent (Curesol 2E4MZ-CN, trade name, made by Shikoku Kasei Co., Ltd.), 0.5 part by weight of a photosensitizer (Kayacure DETX, trade name, made by Nippon Kayaku Co., Ltd.) and 5 parts by weight of a photocuring initiator (Irgacure 907, trade name, made by Ciba Geigy).

(2) Exposure and Development Conditions for Resist

The resist composition for the application is dried at 60° C. for 30 minutes and a Mylar film of 16 μm is applied thereto, which is exposed to an ultraviolet ray at 1 $J/cm^2$ through a parallel exposing machine (Orc), heated at 70° C. for 20 minutes, developed with DMTG, dried at 80° C. for 1 hour, exposed to an ultraviolet ray at 5 $J/cm^2$, and heated at 100° C. for 1 hour, at 120° C. for 1 hour and at 150° C. for 5 hours.

When a continuity test is made to the thus obtained printed wiring board having a pattern of L/S=25/25 μm, a ratio of product having no continuity (percentage of rejects) is 0.4%. When the board is subjected to a gas phase cooling-heating cycle test of −65° C.–125° C. for 1000 cycles, a change rate of conductive resistance is not more than 1%.

EXAMPLE 3

A printed wiring board is produced by repeating the same procedure as in Example 1 except that 5 parts by weight of liquid imidazole curing agent (Curesol 1B2MZ, trade name, made by Shikoku Kasei Co., Ltd.) is used as a curing agent. When a continuity test is made to the thus obtained printed wiring board having a pattern of L/S=25/25 μm, a ratio of product having no continuity (percentage of rejects) is 0.5%. When the board is subjected to a gas phase cooling-heating cycle test of −65° C.–125° C. for 1000 cycles, a change rate of conductive resistance is not more than 1%.

Comparative Example 1

A printed wiring board is produced by repeating the same procedure as in Example 1 except that 4 parts by weight of powdery imidazole curing agent (Curesol 2PHZ, trade name, made by Shikoku Kasei Co., Ltd.) is used as a curing agent.

When a continuity test is made to the thus obtained printed wiring board having a pattern of L/S=25/25 µm, a ratio of product having no continuity (percentage of rejects) is 5.3%. When the board is subjected to a gas phase cooling-heating cycle test of −65° C.–125° C. for 1000 cycles, a change rate of conductive resistance is not more than 3%.

Production Example 1

In xylene solvent are mixed 2-ethylhexyl acrylate and butyl acrylate at a weight ratio of 53:47, which are copolymerized by using dimethylaniline (tertiary amine) as an initiator and heating at 50° C. according to usual manner. Similarly, each of 2-ethyl acrylate and hydroxyethyl acrylate is homopolymerized alone.

Then, the copolymer of 2-ethylhexyl acrylate and butyl acrylate, the homopolymer of ethyl acrylate and the homopolymer of hydroxyethyl acrylate are mixed at a weight ratio of 2-ethylhexyl acrylate to butyl acrylate to ethyl acrylate to hydroxyethyl acrylate of 49:42:6:3 and then heated to remove xylene.

The thus obtained composition does not show the reprecipitation of polymer with methanol and is guessed to have a molecular weight of about 2000–3000.

Figure 2:
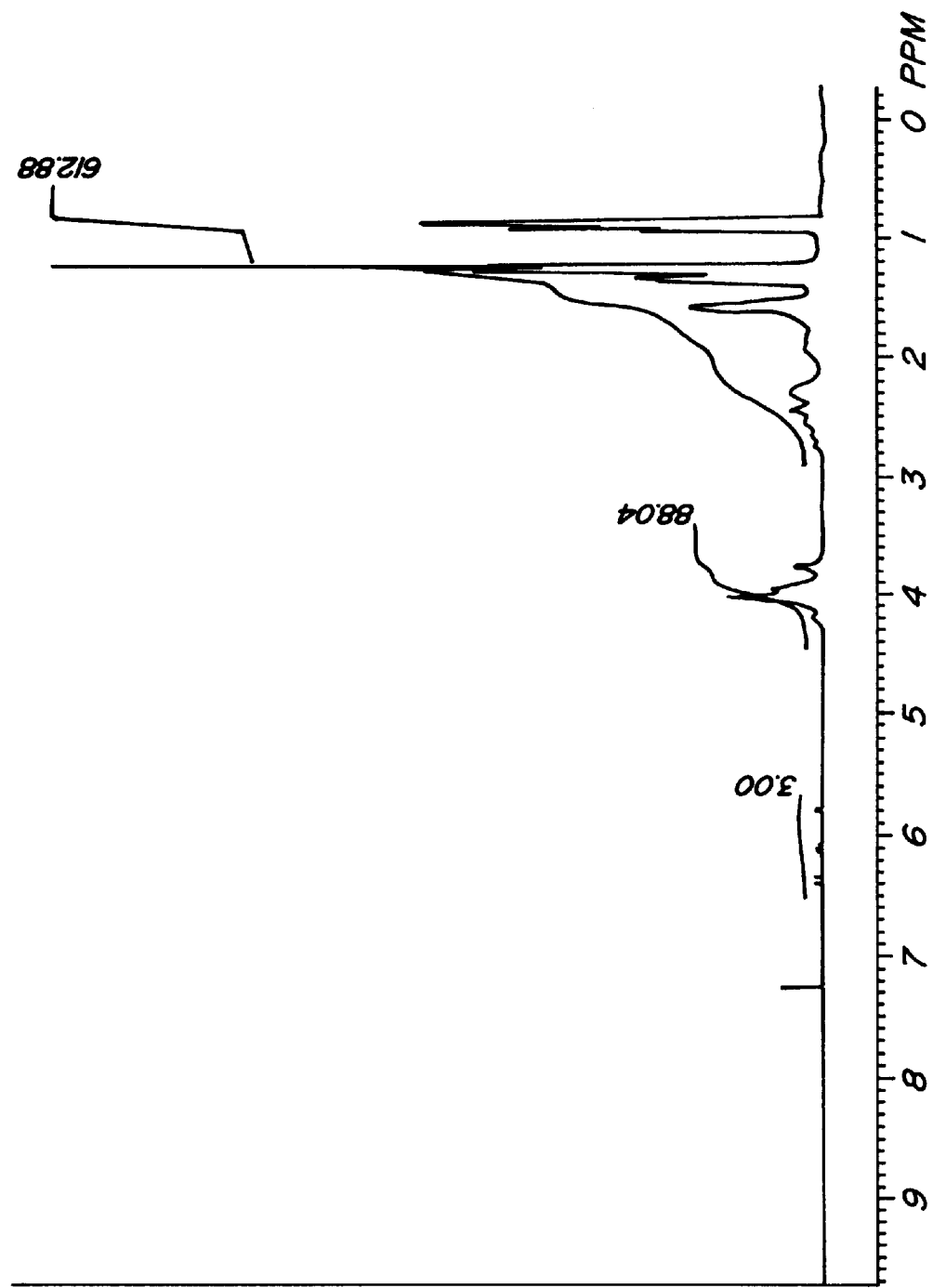
FIG. 2 is a 1H-NMR spectrum of an acrylic ester polymer obtained in Production Example 1.
Figure 3:
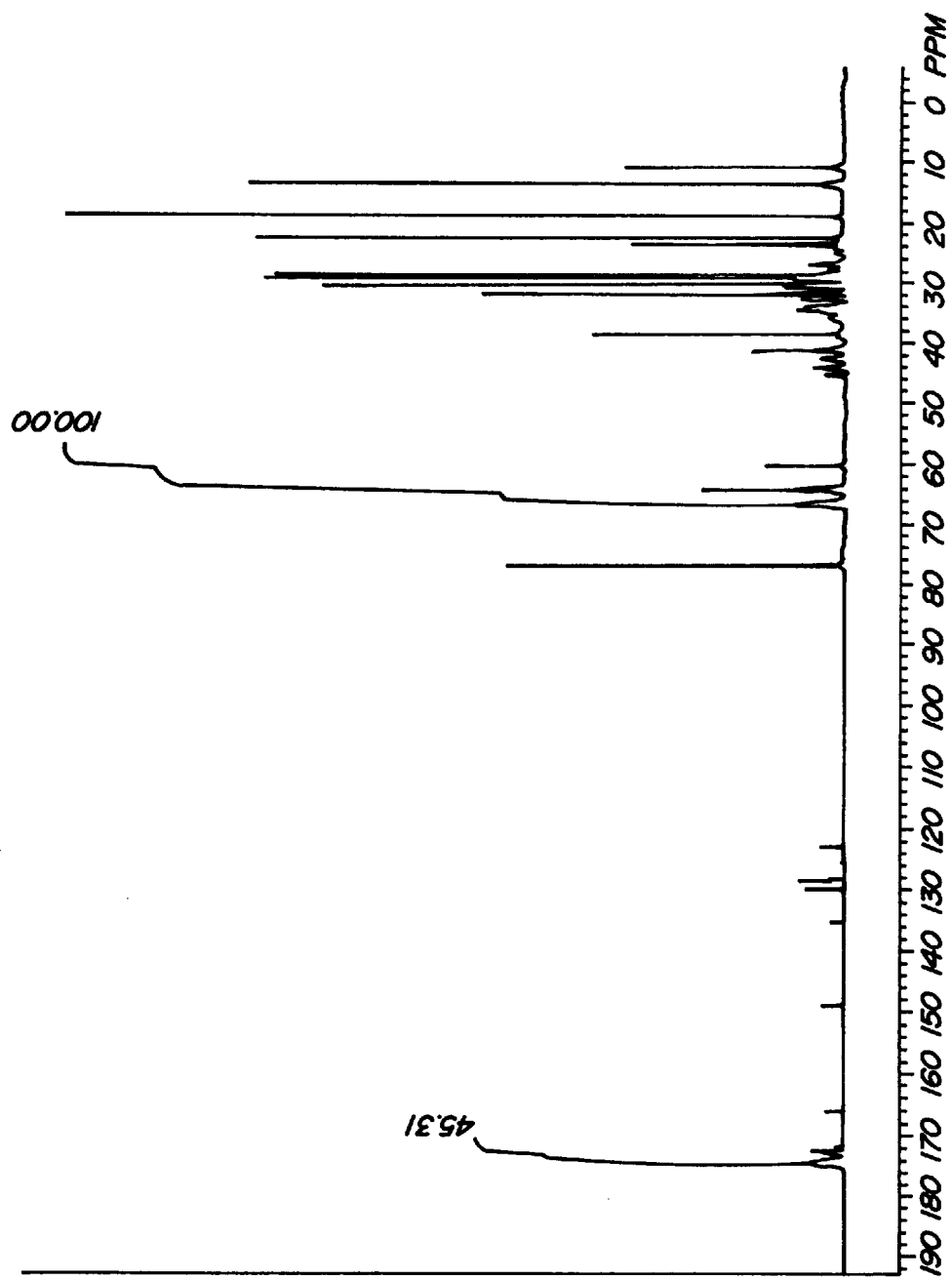
FIG. 3 is a 13C-NMR spectrum of an acrylic ester polymer obtained in Production Example 1.
Figure 4:
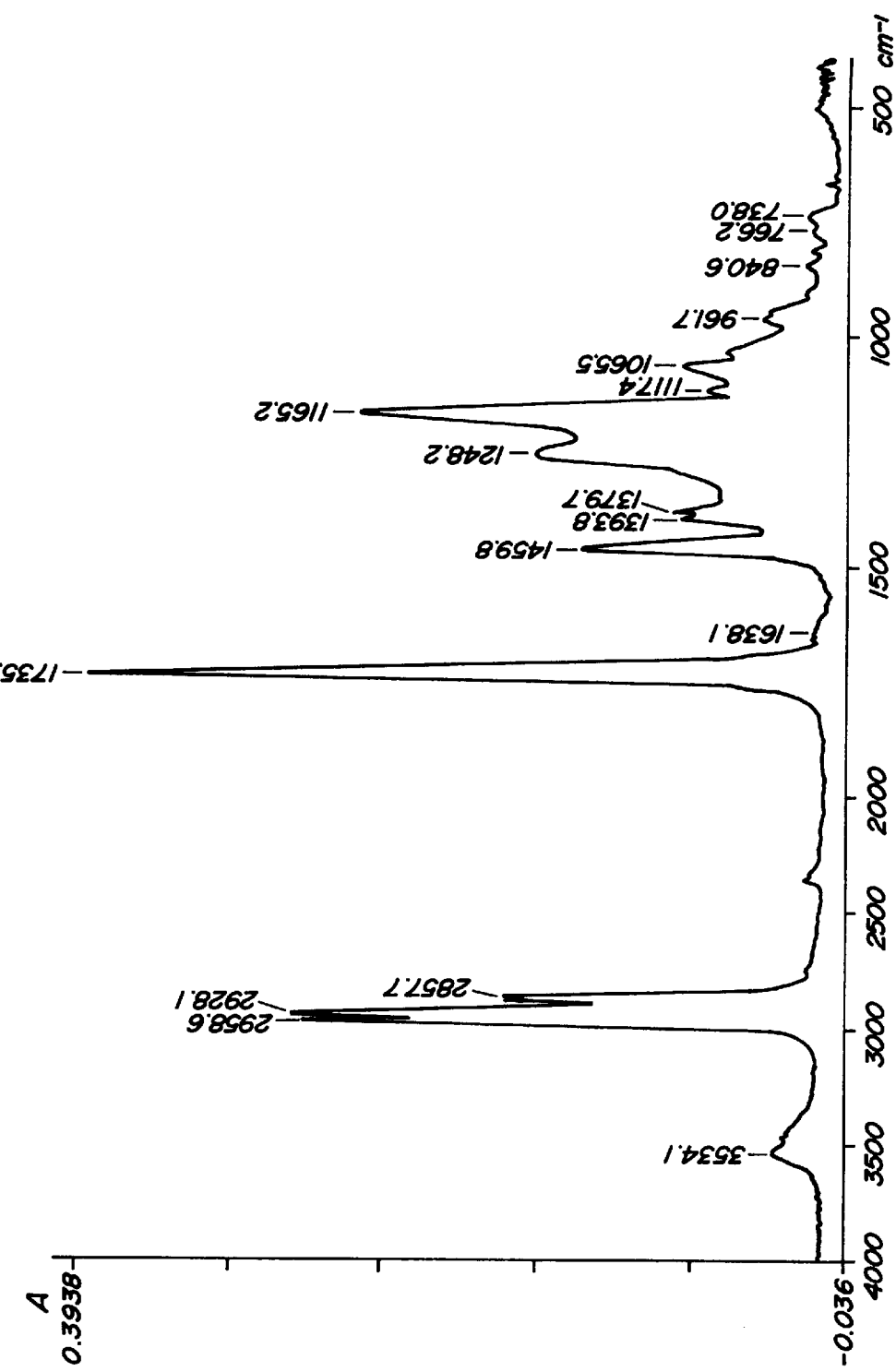
FIG. 4 is an FT-IR spectrum of an acrylic ester polymer obtained in Production Example 1.

Further, this composition has 1H-NMR, 13C-NMR and FT-IR spectra as shown in FIGS. 2 to 4. From these NMR and IR data, it is proved that the synthesized product is an acrylic ester polymer.

EXAMPLE 4

(1) A copper-clad laminate is formed by laminating copper foils of 18 µm onto both surfaces of a substrate of bismaleimide triazine (BT) having a thickness of 1 mm, and then these copper foils are etched in form of a pattern according to usual manner to form innerlayer copper patterns on both surfaces of the substrate.

(2) The substrate is washed with water, dried, degreased with acid and subjected to a soft etching. A Pd catalyst is applied to the substrate by treating with a catalyst solution of palladium chloride and organic acid, activated and subjected to a plating in an electroless plating bath to form an uneven layer (roughened surface) of Ni—P—Cu alloy having a thickness of 2.5 µm on a surface of a pad comprising copper conductors and viaholes.

Then, the substrate is washed with water and immersed in an electroless tin plating bath comprised of tin borofluoride-thiourea solution at 50° C. for 1 hour to form a tin-substituted plating layer having a thickness of 0.3 µm on the roughened surface of Ni—Cu—P alloy.

(3) A photosensitive adhesive solution is prepared by mixing 70 parts by weight of 25% acrylated product of cresol-novolac type epoxy resin (molecular weight: 2500, made by Nippon Kayaku Co., Ltd.) dissolved in diethylene glycol dimethyl ether (DMDG), 30 parts by weight of polyether sulfon (PES), 4 parts by weight of imidazole curing agent (2E4MZ-CN, trade name, made by Shikoku Kasei Co., Ltd.), 10 parts by weight of caprolactone-modified tris(acroxyethyl) isocyanurate (Aronix M325, trade name, made by Toa Gosei Co., Ltd.) as a photoinitiator, 0.5 part by weight of Micheler's ketone (made by Kanto Kagaku Co., Ltd.) as a photosensitizer, 35 parts by weight of epoxy resin particles having an average particle size of 5.5 µm and 5 parts by weight of the epoxy resin particle having an average particle size of 0.5 µm, adding with N-methylpyrrolidone (NMP), adjusting a viscosity of the resulting mixture to 2000 cps in a homodisper stirring machine and kneading through three rolls.

(4) An insulating resin composition is prepared by mixing 70 parts by weight of 25% acrylated product of cresol-novolac type epoxy resin (made by Nippon Kayaku Co., Ltd.), 25 parts by weight of polyether sulfon (made by Mitsui Toatsu Chemicals, Inc.), 4 parts by weight of benzophenone, 0.4 part by weight of Micheler's ketone and imidazole curing agent, adding with N-methylpyrrolidone (NMP), adjusting a viscosity to 30,000 cps in a homodisper stirring machine and kneading through three rolls.

(5) The insulating resin composition of the item (4) and the photosensitive adhesive solution of the item (3) are applied to both surfaces of the substrate of the item (2) by means of a roll coater (made by Dainippon Screen Co., Ltd.) in this order, left to stand at a horizontal state for 20 minutes and dried at 60° C. for 30 minutes to form an interlaminar resin insulating layer comprised of the insulating resin layer and the photosensitive adhesive layer and having a thickness of 60 µm.

(6) A photomask film is laminated on the substrate, exposed to an ultraviolet ray and developed by spraying diethylene glycol dimethyl ether (DMDG) to form openings for viahole having a diameter of 100 µm on the adhesive layer. Further, the substrate is exposed to a super-high pressure mercury lamp at 3000 mJ/cm$^2$ and heated at 100° C. for 1 hour and at 150° C. for 5 hours to form a cured interlaminar resin insulating layer (two-layer structure) of 50 µm in thickness having the openings (for viahole) corresponding to the photomask film with an excellent dimensional accuracy. Moreover, the tin plated layer is partially exposed in the opening for viahole.

(7) The substrate having the openings is immersed in chromic acid for 2 minutes to remove the epoxy resin particles from the interlaminar resin insulating layer, whereby the surface of the interlaminar resin insulating layer is roughened. Then, the substrate is immersed in a neutral solution (made by Shipley) and washed with water.

(8) A palladium catalyst (made by Atotec) is applied to the thus roughened substrate (roughened depth: 20 µm) to form a catalyst nucleus on the interlaminar resin insulating layer and the openings for viahole.

(9) A mixing solution A is prepared by mixing 100 parts by weight of a photosensitive oligomer (molecular weight: 4000) in which 50% of epoxy group in 40% by weight of cresol-novolac type epoxy resin (made by Nippon Kayaku Co., Ltd.) dissolved in diethylene glycol dimethyl ether (DMDG) is acrylated, 32 parts by weight of 20% by weight of bisphenol-A type epoxy resin (Epikote 1001, trade name, made by Yuka Shell Co., Ltd.) dissolved in methyl ethyl ketone, 3.4 parts by weight of imidazole curing agent (2E4MZ-CN, trade name, made by Shikoku Kasei Co., Ltd.), and 6.4 parts by weight of polyvalent acryl monomer (R604, trade name, made by Nippon Kayaku Co., Ltd.) and 3.2 parts by weight of polyvalent acryl monomer (DPE6A, trade name, made by Kyoeisha Kagaku Co., Ltd.) as a photosensitive monomer and adding 0.5 part by weight of the acrylic ester polymer prepared in Production Example 1 based on 100 parts by weight of the resulting mixture with stirring.

A mixing solution B is prepared by dissolving 4.3 parts by weight of benzophenone (made by Kanto kagaku Co., Ltd.) as a photoinitiator and 0.4 part by weight of Micheler's ketone (made by Kanto kagaku Co., Ltd.) as a photosensitizer in 6.4 parts by weight of diethylene glycol dimethyl ether (DMDG) heated to 40° C.

Figure 5:
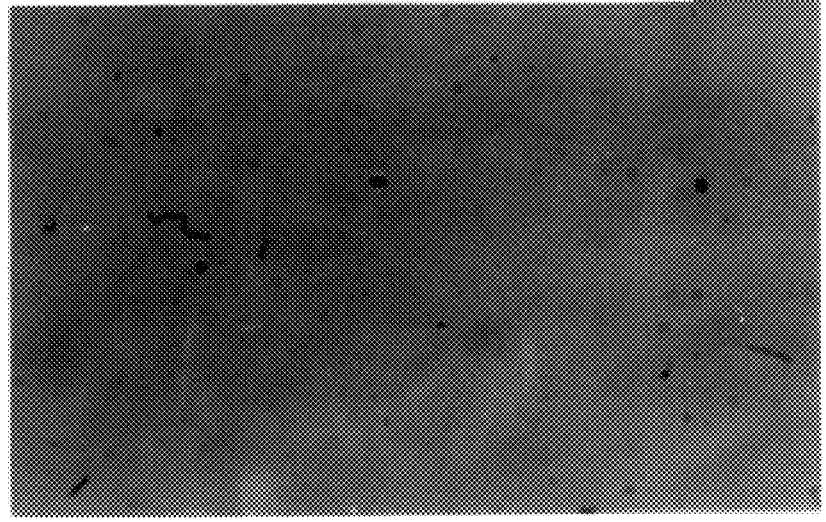
FIG. 5 is an optical photomicrograph (250×magnification) of a resist composition for plating obtained in Example 4.

Then, the mixing solution A and the mixing solution B are mixed with stirring to obtain a resist composition for plating according to the invention. In FIG. 5 is shown an optical photomicrograph of the resist composition, from which it is clear that the composition is a completely homogeneous layer and has no foreign matter. Moreover, black spots appearing in this photomicrograph are dusts adhered to a lens of the microscope and are not inclusions in the solution, which is clear in comparison with a photomicrograph of a resist composition in Comparative Example 2 as mentioned below (see FIG. 6).

(10) The resist composition of the item (9) is applied onto both surfaces of the substrate treated in the item (8) by means of a roll coater and dried at 60° C. for 30 minutes to form a resist layer having a thickness of 30 $\mu$m.

The resist layer is uniformly formed on the whole surface of the substrate and also there is no unevenness in the surface of the resist layer.

(11) A mask having patterns of L/S=30/30 $\mu$m and 40/40 $\mu$m is laminated onto the resist layer and exposed to an ultraviolet ray.

(12) The thus treated resist layer is developed with triethylene glycol dimethyl ether (DMTG) to form a resist pattern for plating having no conductor circuit pattern on the substrate, which is further exposed to a super-high pressure mercury lamp at 6000 mJ/cm$^2$ and heated at 100° C. for 1 hour and at 150° C. for 3 hours to form a permanent resist of a given pattern on the substrate.

Figure 7:
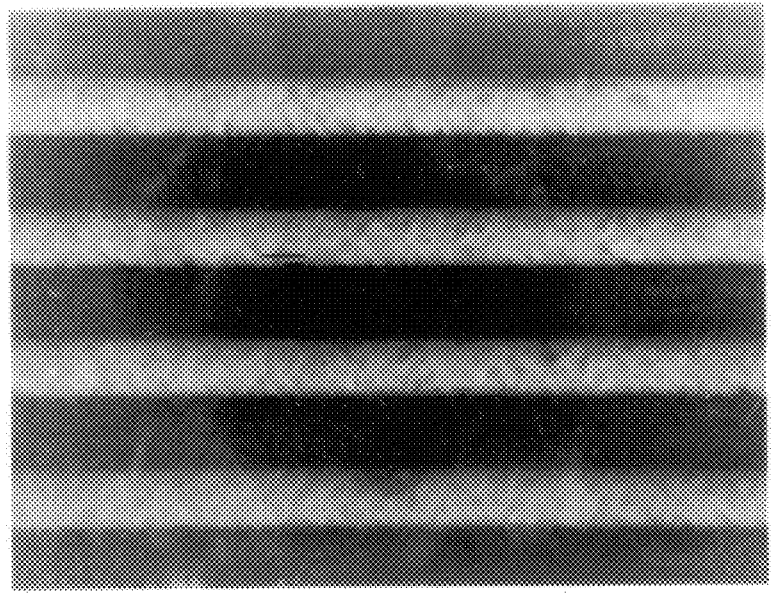
FIG. 7 is an optical photomicrograph (200×magnification) of a fine pattern at L/S=40/40 μm formed by the development treatment after the curing of the resist composition obtained in Example 1.
Figure 8:
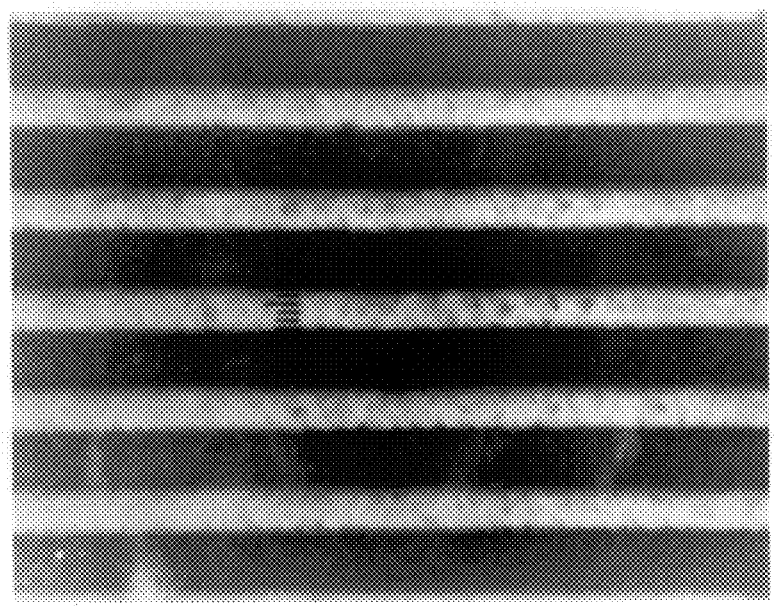
FIG. 8 is an optical photomicrograph (200×magnification) of a fine pattern at L/S=30/30 μm formed by the development treatment after the curing of the resist composition obtained in Example 1.

In FIGS. 7 and 8 are shown optical photomicrographs of the developed pattern states, from which it is clear that no development residue is existent on the resist according to the invention.

(13) The substrate provided with the permanent resist is subjected to a preliminary treatment for plating (e.g. treatment with sulfuric acid and activation of catalyst nucleus) and then subjected to an electroless plating in an electroless copper plating bath, whereby an electroless copper plated film having a thickness of about 15 $\mu$m is precipitated on a portion having no resist to form an outerlayer copper pattern and viaholes. That is, the conductor layer is formed by the additive method.

(14) The conductor layer formed on each of both surfaces of the substrate by the additive method is polished by using a polishing paper of #600 in a belt sander. In this case, the polishing is carried out so as to match the surface of the permanent resist with an uppermost surface of copper in the viahole. Thereafter, buffing is carried out for removing flaws caused by the belt sander. Thus, a printed wiring board being flat in both surfaces is obtained after the polishing on both surfaces.

By repeating the above-mentioned steps, another conductor layer is formed on the board through the additive method. In this way, there is formed a multilayer printed wiring board having 6 built-up conductor layers.

EXAMPLE 5

The same procedure as described in Example 4 is repeated except that benzophenone and Michler's ketone are dissolved in N-methyl pyrrolidone of room temperature (25° C.) instead of diethylene glycol dimethyl ether (DMDG) in the preparation of the mixing solution B in the item (9) of Example 4. In this case, no development residue is existent on the resist and the surface smoothness is excellent.

EXAMPLE 6

The same procedure as in Example 4 is repeated except that the resist composition in the item (9) of Example 4 is prepared as follows:

A liquid resist composition is prepared by mixing 70 parts by weight of a photosensitive oligomer (molecular weight: 4000) in which 50% of epoxy group in cresol-novolac type epoxy resin (EOCN-103S, trade name, made by Nippon Kayaku Co., Ltd.) dissolved in diethylene glycol dimethyl ether (DMDG) is acrylated, 30 parts by weight of polyether sulfon, 5 parts by weight of imidazole curing agent (2E4MZ-CN, trade name, made by Shikoku Kasei Co., Ltd.), 10 parts by weight of acrylic isocyanate (Aronix M215, trade name, made by Toa Gosei Co., Ltd.) as a photosensitive monomer, 5 parts by weight of benzophenone (made by Kanto kagaku Co., Ltd.) as a photoinitiator and 0.5 part by weight of Micheler's ketone (made by Kanto kagaku Co., Ltd.) as a photosensitizer, adding 0.5 part by weight of the acrylic ester polymer prepared in Production Example 1 based on 100 parts by weight of the resulting mixture in diethylene glycol dimethyl ether (DMDG) at room temperature (25° C.), adjusting a viscosity to 3000 cps in a homodisper stirring machine and then kneading through three rolls.

This resist composition is confirmed to be not completely homogeneous and contain residue of undissolved benzophenone and Michler's ketone (both are powder).

When such a resist composition is subjected to exposure and development treatments, the resulting resist surface is smooth and is not repulsed by dusts, but the development residue is slightly existent on the resist.

Comparative Example 2

The same procedure as in Example 4 is repeated except that a liquid resist composition is prepared by using a disperse anti-foaming agent (S-65, trade name, made by Sannopco) as an anti-foaming agent instead of the acrylic ester polymer in the item (9) of Example 4.

Figure 6:
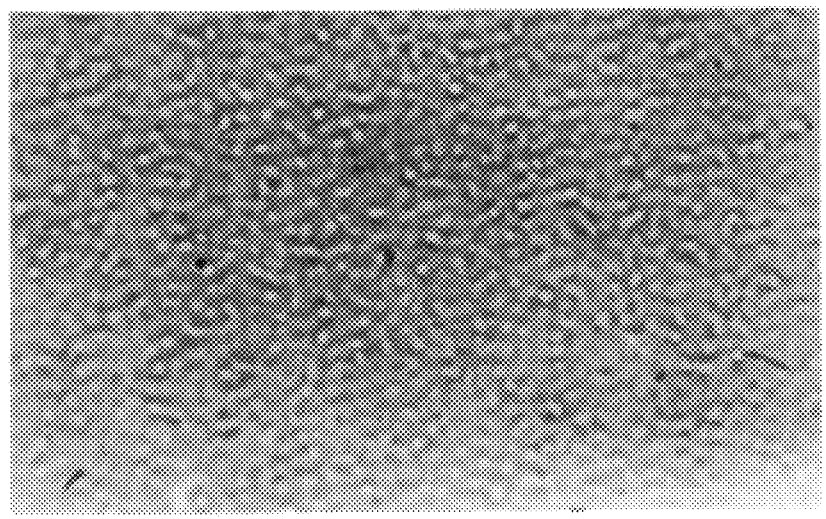
FIG. 6 is an optical photomicrograph (250×magnification) of a resist composition for plating obtained in Comparative Example 2.

In FIG. 6 is shown an optical photomicrograph of this resist composition, from which it is clear that the composition is not completely homogeneous and the dispersing phase of the anti-foaming agent is existent in the composition.

When this resist composition is subjected to exposure and development treatments, the resulting resist surface is not smooth and the development residue is considerably created.

As mentioned above, according to the invention, there can be provided with a fine structure having excellent photosensitive properties, resistance to alkali and heat resistance and an improved surface smoothness without causing development residue irrespectively of anchor depth. Therefore, printed wiring boards having a high conduction reliability without breaking and a strong heat cycle property can be provided by using such a resist composition for plating.

What is claimed is:

1. A resist composition for plating comprising an uncured novolac epoxy resin in which a part of the epoxy group is acrylated as a photosensitive resin ingredient; an imidazole curing agent; an acrylic ester polymer having a weight average molecular weight of 500–5000; and benzophenone and Michler's ketone dissolved in a solvent of glycol ether or N-methyl pyrrolidone.

2. A resist composition according to claim 1, wherein the glycol ether is diethylene glycol dimethyl ether or triethylene glycol dimethyl ether.

3. A method of producing a resist composition for plating comprising an uncured novolac epoxy resin in which a part of the epoxy group is acrylated as a photosensitive resin ingredient; and an imidazole curing agent, characterized in that the composition is compounded with an acrylic ester resin having a weight average molecular weight of 500–5000 and added with a benzophenone and a Michler's ketone, mixed and dissolved in a solvent of glycol ether or N-methyl pyrrolidone.

\* \* \* \* \*